(12) United States Patent
Essig (10) Patent No.: US 10,005,660 B1
(45) Date of Patent: Jun. 26, 2018

(54) SEMICONDUCTOR PACKAGE DEVICE INCLUDING MICROELECTROMECHANICAL SYSTEM

(71) Applicant: Advanced Semiconductor Engineering, Inc., Kaohsiung (TW)

(72) Inventor: Kay Stefan Essig, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days. days.

(21) Appl. No.: 15/433,793

(22) Filed: Feb. 15, 2017

(51) Int. Cl.
*B81C 1/00* (2006.01)
*B81B 7/00* (2006.01)

(52) U.S. Cl.
CPC .......... *B81C 1/0023* (2013.01); *B81B 7/0064* (2013.01); *B81B 2201/0214* (2013.01); *B81B 2201/0235* (2013.01); *B81B 2201/0242* (2013.01); *B81B 2201/0257* (2013.01); *B81B 2201/0264* (2013.01); *B81B 2207/012* (2013.01); *B81C 2203/0785* (2013.01)

(58) Field of Classification Search
CPC .......... B81B 7/0064; B81B 2201/0214; B81C 1/0023; B81C 1/00047; B81C 1/00071; B81C 1/00277; B81C 1/00261
See application file for complete search history.

(56) References Cited

U.S. PATENT DOCUMENTS

| | | | |
|---|---|---|---|
| 7,657,025 B2 | 2/2010 | Hsu et al. | |
| 8,263,434 B2 | 9/2012 | Pagaila et al. | |
| 8,349,635 B1* | 1/2013 | Gan | G01L 9/0019 257/E23.18 |
| 8,847,375 B2 | 9/2014 | Shah et al. | |
| 8,872,288 B2 | 10/2014 | Fuergut et al. | |
| 9,013,011 B1 | 4/2015 | Kuo et al. | |
| 2012/0142144 A1* | 6/2012 | Taheri | B81B 7/007 438/107 |
| 2015/0137341 A1* | 5/2015 | Liu | H01L 23/5386 257/692 |
| 2015/0259194 A1* | 9/2015 | Lin | B81B 7/007 257/773 |

* cited by examiner

*Primary Examiner* — Mohsen Ahmadi
(74) *Attorney, Agent, or Firm* — Foley & Lardner LLP; Cliff Z. Liu (57) ABSTRACT

The present disclosure relates to a semiconductor package device. The semiconductor package device includes a carrier, a first Micro Electro Mechanical Systems (MEMS) and a first electronic component. The carrier has a first surface and a second surface opposite the first surface. The MEMS is disposed in the carrier. The first MEMS is exposed from the first surface of the carrier and is exposed from the second surface of the carrier. The first electronic component is disposed on the first surface of the carrier and is electrically connected to the first MEMS.

18 Claims, 11 Drawing Sheets

SEMICONDUCTOR PACKAGE DEVICE INCLUDING MICROELECTROMECHANICAL SYSTEM

BACKGROUND

1. Technical Field

The present disclosure relates to a semiconductor package device, and more particularly to a semiconductor package device including a Micro Electro Mechanical System (MEMS).

2. Description of the Related Art

MEMS (as used herein, the term "MEMS" may be used to refer to a singular Micro Electro Mechanical System or to plural Micro Electro Mechanical Systems) are widely used in semiconductor devices to detect a signal (such as sound, movement/motion, pressure, gas, humidity, temperature and the like) and to transform the detected signal to an electrical signal. Semiconductor devices have become progressively more complex, driven at least in part by the demand for smaller sizes and enhanced processing speeds. At the same time, there is a demand to further miniaturize many electronic products containing these semiconductor devices. It may be desirable in some cases to reduce the space occupied by MEMS on a substrate of a semiconductor device, and to simplify and combine packaging, board manufacturing, and assembly processes applicable to the semiconductor device and the substrate.

SUMMARY

In some embodiments, according to one aspect of the present disclosure, a semiconductor package device includes a carrier, a first Micro Electro Mechanical Systems (MEMS) and a first electronic component. The carrier has a first surface and a second surface opposite the first surface. The MEMS is disposed in the carrier. The first MEMS is exposed from the first surface of the carrier and is exposed from the second surface of the carrier. The first electronic component is disposed on the first surface of the carrier and is electrically connected to the first MEMS.

In some embodiments, according to another aspect of the present disclosure, a semiconductor package device includes a carrier, a MEMS and a processing chip. The carrier has a first surface and a second surface opposite the first surface. The MEMS is disposed within the carrier. A thickness of the MEMS is substantially the same as a thickness of the carrier. The processing chip is disposed on the first surface of the carrier and is electrically connected to the first MEMS.

In some embodiments, according to another aspect of the present disclosure, a semiconductor package device includes a carrier, a MEMS and a processing chip. The carrier has a first surface and a second surface opposite the first surface. The MEMS is disposed within the carrier, and has a top surface and a bottom surface. The top surface of the MEMS is substantially coplanar with the first surface of the carrier and the bottom surface of the MEMS is substantially coplanar with the second surface of the carrier. The processing chip is disposed over the MEMS and electrically connected to the first MEMS.

BRIEF DESCRIPTION OF THE DRAWINGS

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
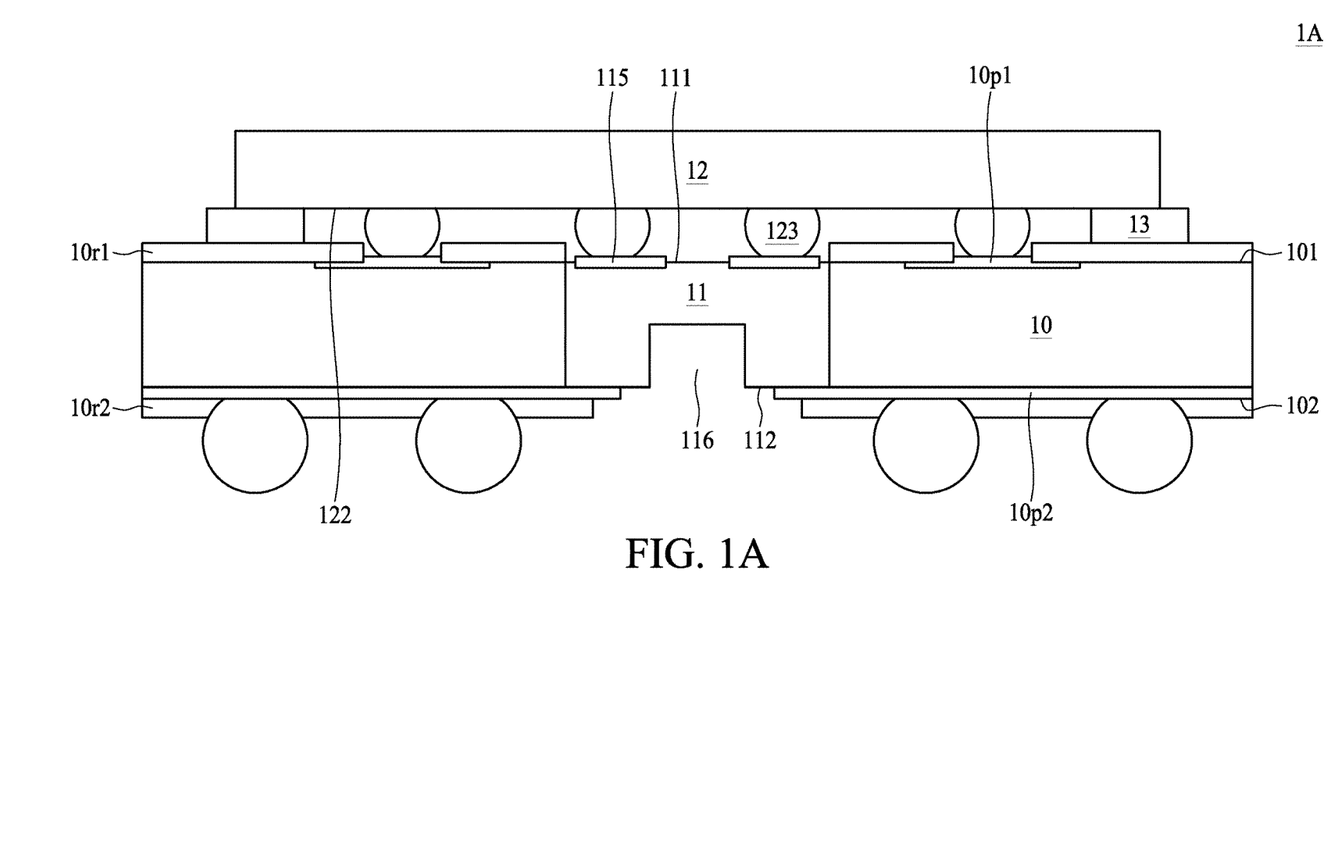
FIG. 1A illustrates a cross-sectional view of a semiconductor package structure in accordance with some embodiments of the present disclosure.

FIG. 1A illustrates a semiconductor package structure 1A in accordance with some embodiments of the present disclosure. The semiconductor package structure 1A includes a carrier 10, MEMS 11, an electronic component 12 and a ring block structure 13.

The carrier 10 may be, for example, a printed circuit board, such as a paper-based copper foil laminate, a composite copper foil laminate, or a polymer-impregnated glass-fiber-based copper foil laminate. The carrier 10 may include an interconnection structure, such as a redistribution layer (RDL) or a grounding element. The carrier 10 has a surface 101 and a surface 102 opposite to the surface 101. In some embodiments, the surface 101 of the substrate is referred to as a top surface or a first surface and the surface 102 of the substrate is referred to as a bottom surface or a second surface. The carrier 10 includes conductive pads 10$p$1 on its top surface 101 and conductive pads 10$p$2 on its bottom surface 102 to provide electrical connections. In some embodiments, a solder resist layer 10$r$1 may be disposed on the top surface 101 of the carrier 10 to cover a portion of the top surface 101 and a portion of the conductive pads 10$p$1. In addition, a solder resist layer 10$r$2 may be disposed on the bottom surface 102 of the carrier 10 to cover a portion of the bottom surface 102 and a portion of the conductive pads 10$p$2.

The MEMS 11 is embedded within the carrier 10. A surface 111 (e.g., a top surface or a backside surface) of the MEMS 11 is substantially coplanar with the top surface 101 of the carrier 10. A surface 112 (e.g., a bottom surface) of the MEMS 11 is substantially coplanar with the bottom surface 102 of the carrier 10. For example, the top surface 111 of the MEMS 11 is exposed from the top surface 101 of the carrier 10 and the bottom surface 112 of the MEMS 11 is exposed from the bottom surface 102 of the carrier 10. For example, a thickness of the MEMS 11 is substantially the same as that of the carrier 10.

In some embodiments, a circuit layer 115 may be disposed on the top surface 111 of the MEMS 11. The circuit layer 115 may provide electrical connections between the MEMS 11 and other components or circuits. The circuit layer 115 is exposed from the top surface 101 of the carrier 10.

In some embodiments, the MEMS 11 may include a sensing port 116 to receive at least one physical signal (e.g., sound, pressure, temperature, humidity, gas and the like) and to convert the received physical signal to an electrical signal (e.g. for subsequent processing). The sensing port 116 is exposed from the bottom surface 102 of the carrier 10. In some embodiments, the MEMS 11 can be a microphone, a barometer, a thermometer, a hygrometer, a gas detector and the like.

The electronic component 12 is disposed on the top surface 101 of the carrier 10. The electronic component 12 may have a bottom surface 122. The electronic component 12 may be an active component, such as an integrated circuit (IC) chip or a die. In some embodiments, the electronic component 12 may be an application-specific integrated circuit (ASIC). The electronic component 12 may be electrically connected to the conductive pads 10p1 on the top surface 101 of the carrier 10 by way of flip-chip or wire-bond techniques. In some embodiments, some conductive contacts 123 of the electronic component 12 directly contact the circuit layer 115 on the top surface 111 of the MEMS 11 to receive signals from the MEMS 11.

The ring block structure 13 is disposed on the top surface 101 of the carrier 10 and under a portion of the bottom surface 122 of the electronic component 12. That is, the ring block structure 13 is disposed between the top surface 101 of the carrier 10 and the bottom surface 122 of the electronic component 12. The ring block structure 13 surrounds all of the conductive contacts of the electronic component 12 and the circuit layer 115 of the MEMS 11, and can help to protect the circuit layer 115 of the MEMS 11 from external contaminations or interferences. In some embodiments, the ring block structure 13 is made of non-conductive materials.

In some existing MEMS devices, MEMS might be disposed on an ASIC, which is in turn disposed on the substrate, and a lid is disposed on the substrate to cover the MEMS and the ASIC. Therefore, the thickness of the MEMS devices (including the lid, the space for the bonding wire, the MEMS, the ASIC and the substrate) is large. In accordance with the embodiments shown in FIG. 1A, by embedding the MEMS 11 within the carrier 10 having a same thickness as the MEMS 11 and directly attaching the conductive contacts of the electronic component 12 to the circuit layer 115 of the MEMS 11, the total volume of the semiconductor package device 1A can be reduced. In some embodiments, the thickness of the semiconductor package device 1A (in a vertical direction as shown in FIG. 1A) is less than or equal to 0.6 mm. In addition, since the electronic component 12 is disposed on the MEMS 11 and the ring block structure 13 surrounds all of the conductive contacts of the electronic component 12 and the circuit layer 115 of the MEMS 11, no lid is required, which would reduce the total volume and manufacturing cost of the semiconductor package device 1A.

Figure 1B:
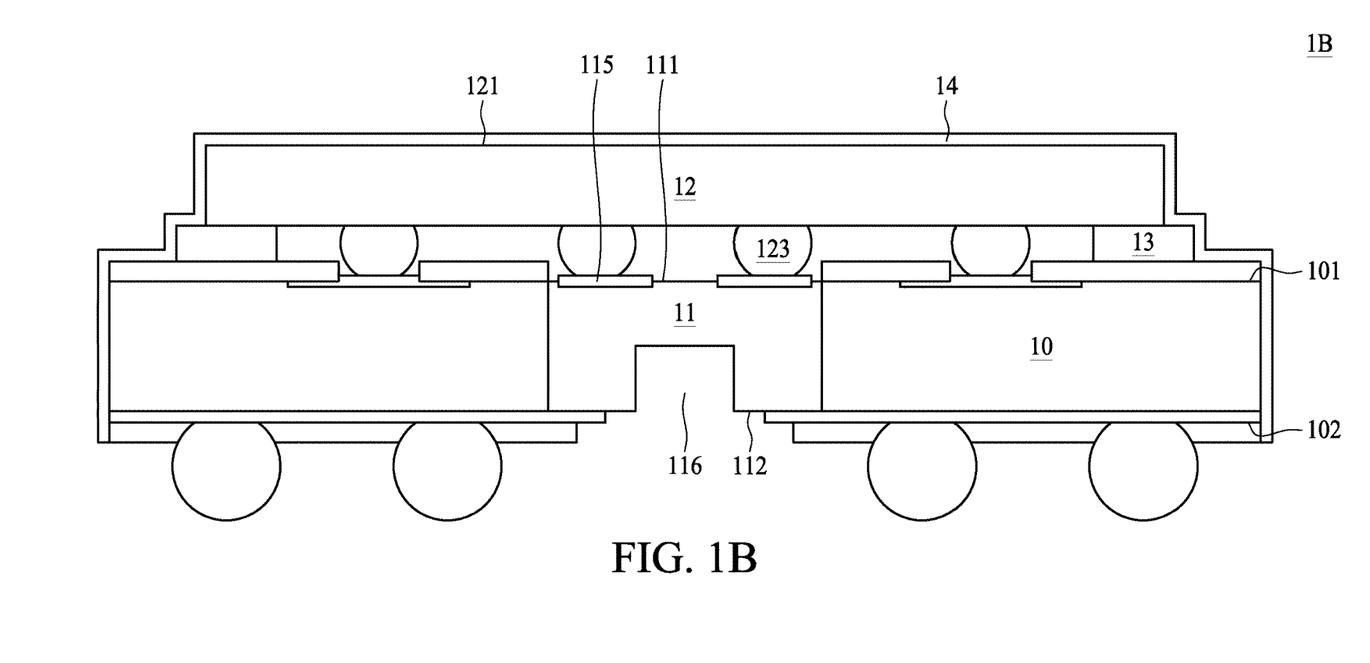
FIG. 1B illustrates a cross-sectional view of a semiconductor package structure in accordance with some embodiments of the present disclosure.

FIG. 1B illustrates a semiconductor package structure 1B in accordance with some embodiments of the present disclosure. The semiconductor package structure 1B is similar to the semiconductor package device 1A shown in FIG. 1A except that the semiconductor package device 1B further includes a shielding layer 14.

The shielding layer 14 covers a surface 121 (e.g., a backside surface or a top surface) and lateral surfaces of the electronic component 12, a portion of the ring block structure 13, a portion of the top surface 101 of the carrier 10 and a lateral surface of the carrier 10. The shielding layer 14 is electrically connected to the grounding element of the carrier 10. The grounding element of the carrier 10 may be formed on the top surface 101 of the carrier, that is, the grounding element may be one of the conductive pads 10p1, which is exposed from the solder resist layers 10r1. In some embodiments, the grounding element is formed in the carrier 10 and exposed from the lateral surface of the carrier 10. The shielding layer 14 can provide electromagnetic interference (EMI) shielding for the electronic component 12 and the MEMS 11. In some embodiments, the shielding layer 14 is a conformal shield. The shielding layer 14 is aligned with a bottom surface 102 of the carrier 10; for example, a bottom of the shielding layer 14 is substantially coplanar with the bottom surface 102 of the carrier 10. In some embodiments, the bottom of the shielding layer 14 is substantially coplanar with the bottom of the solder resist layer 10r2 disposed on the bottom surface 102 of the carrier 10. In some embodiments, the shielding layer 14 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shielding layer 14 may include a single conductive layer or multiple conductive layers. In some embodiments, the shielding layer 14 includes multiple conductive layers, and the multiple conductive layers may include a same material, or some of the multiple conductive layers may include different materials than each other, or each of the multiple conductive layers may include different materials from each other. In some embodiments, each conductive layer of the shielding layer 14 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, each conductive layer of the shielding layer 14 may have a thickness in a range of about 10 nm to about 200 μm. In some embodiments, one or more conductive layers of the shielding layer 14 may be larger than about 200 μm, or smaller than about 10 nm. In some embodiments, the shielding layer 14 includes multiple conductive layers, and different conductive layers may have different thicknesses.

Figure 1C:
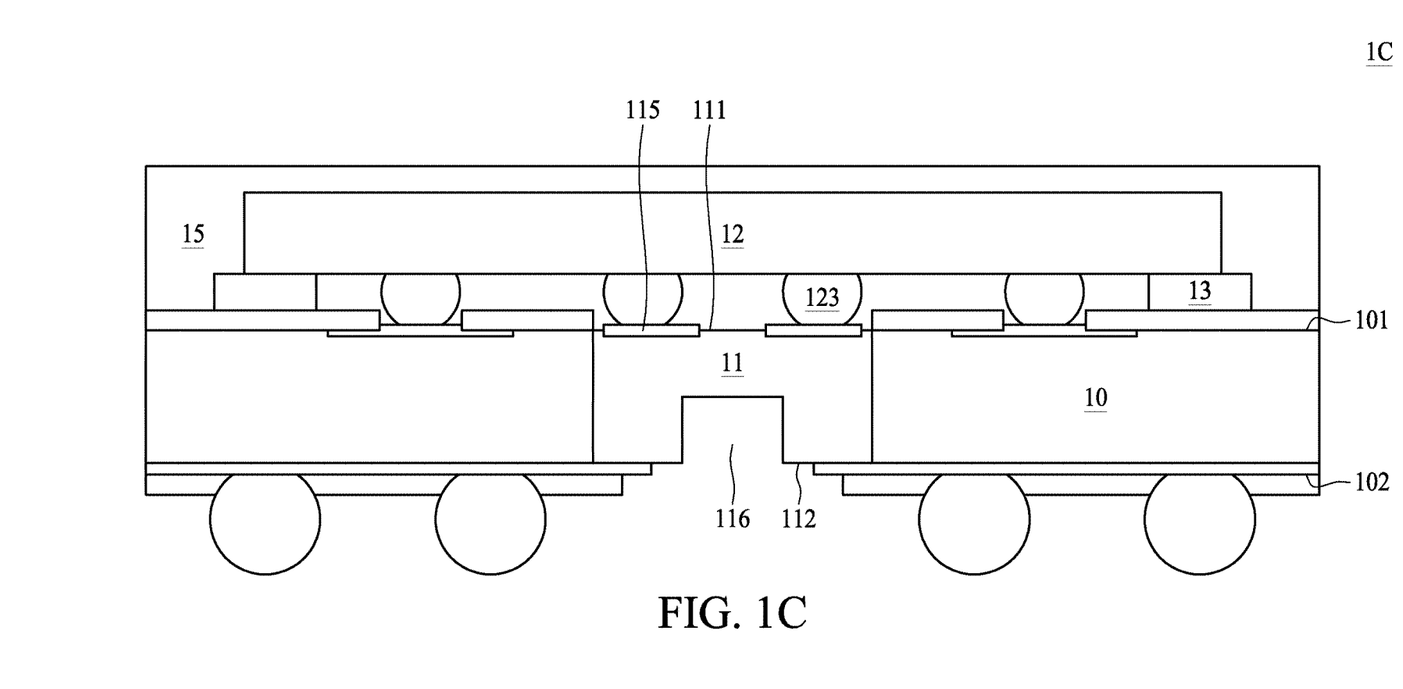
FIG. 1C illustrates a cross-sectional view of a semiconductor package structure in accordance with some embodiments of the present disclosure.

FIG. 1C illustrates a semiconductor package structure 1C in accordance with some embodiments of the present disclosure. The semiconductor package structure 1C is similar to the semiconductor package device 1A shown in FIG. 1A except that the semiconductor package device 1C further includes a package body 15.

The package body 15 is disposed on the top surface 101 of the carrier 10 and encapsulates a part of the top surface 101 of the carrier 10, the electronic component 12 and the ring block structure 13. In some embodiments, the package body 15 includes an epoxy resin having fillers dispersed therein. The package body 15 may provide protection for the electronic component 12 (e.g. protection from physical damage).

Figure 1D:
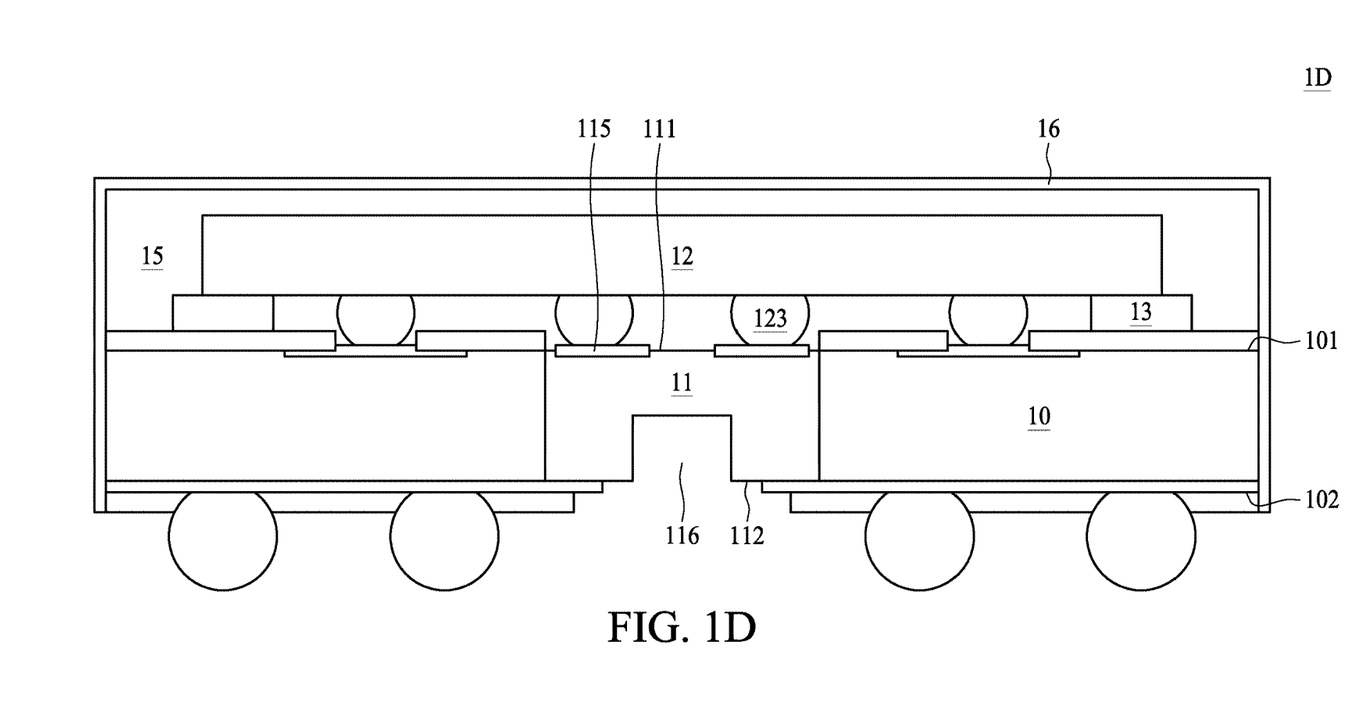
FIG. 1D illustrates a cross-sectional view of a semiconductor package structure in accordance with some embodiments of the present disclosure.

FIG. 1D illustrates a semiconductor package structure 1D in accordance with some embodiments of the present disclosure. The semiconductor package structure 1D is similar to the semiconductor package device 1C shown in FIG. 1C except that the semiconductor package device 1D further includes a shielding layer 16.

The shielding layer 16 covers exterior surfaces of the package body 15 and lateral surfaces of the carrier 10. The shielding layer 16 is electrically connected to the grounding element of the carrier 10. The grounding element of the carrier 10 may be formed on the top surface 101 of the carrier, that is, the grounding element may be one of the conductive pads 10p1, which is exposed from the solder resist layers 10r1. In some embodiments, the grounding element is formed in the carrier 10 and exposed from the lateral surface of the carrier 10. The shielding layer 16 can provide electromagnetic interference (EMI) shielding for the electronic component 12 and the MEMS 11. In some embodiments, the shielding layer 16 is a conformal shield. The shielding layer 16 is aligned with a bottom surface 102 of the carrier 10; for example, a bottom of the shielding layer 16 is substantially coplanar with the bottom surface 102 of the carrier 10. In some embodiments, the bottom of the shielding layer 14 is substantially coplanar with the bottom of the solder resist layer 10r2 disposed on the bottom surface 102 of the carrier 10. In some embodiments, the shielding layer 16 is a conductive thin film, and may include, for example, Al, Cu, Cr, Sn, Au, Ag, Ni or stainless steel, or a mixture, an alloy, or other combination thereof. The shielding layer 16 may include a single conductive layer or multiple conductive layers. In some embodiments, the shielding layer 16 includes multiple conductive layers, and the multiple conductive layers may include a same material, or some of the multiple conductive layers may include different materials than each other, or each of the multiple conductive layers may include different materials from each other. In some embodiments, each conductive layer of the shielding layer 16 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, each conductive layer of the shielding layer 14 may have a thickness in a range of about 10 nm to about 200 μm. In some embodiments, one or more conductive layers of the shielding layer 14 may be larger than about 200 μm, or smaller than about 10 nm. In some embodiments, the shielding layer 16 includes multiple conductive layers, and different conductive layers may have different thicknesses.

Figure 2:
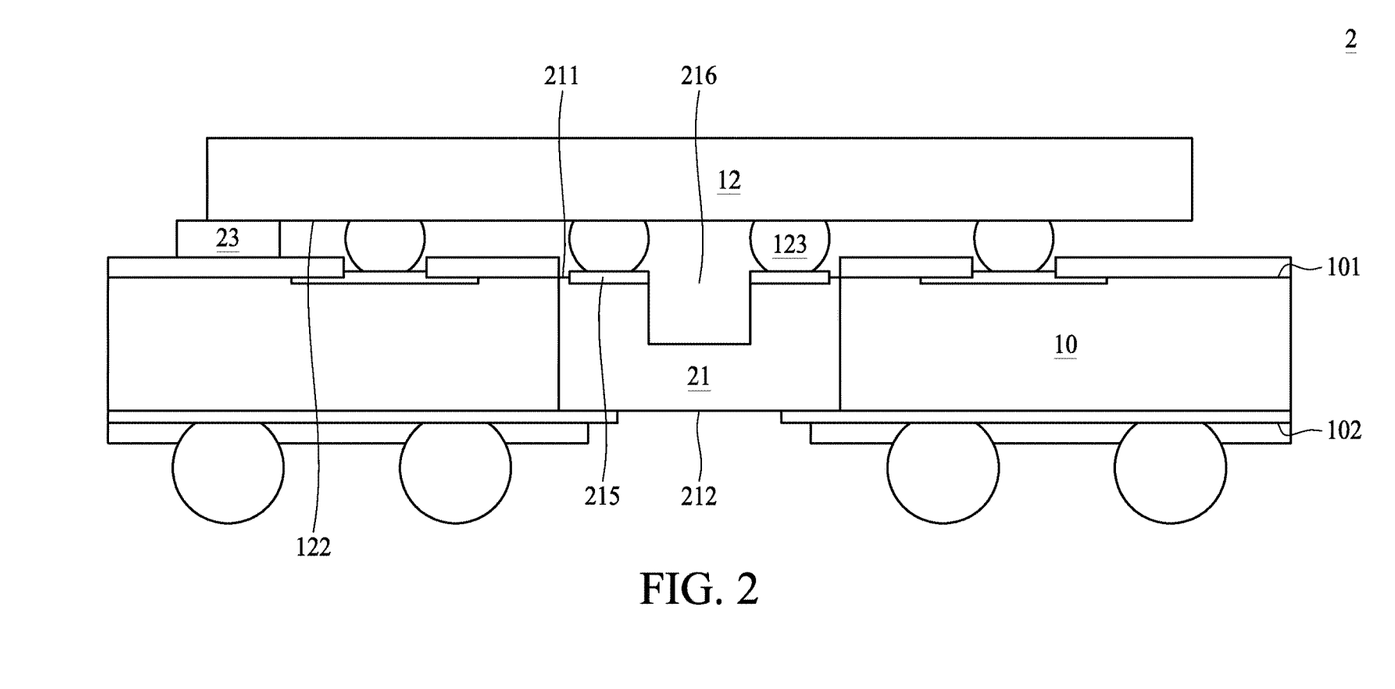
FIG. 2 illustrates a cross-sectional view of a semiconductor package structure in accordance with some embodiments of the present disclosure.

FIG. 2 illustrates a semiconductor package structure 2 in accordance with some embodiments of the present disclosure. The semiconductor package structure 2 is similar to the semiconductor package device 1A shown in FIG. 1A, but differs at least in that a sensing port 216 of the MEMS 21 of the semiconductor package device 2 faces toward the electronic component 12 (rather than away from the electronic component 12, as in the configuration depicted in FIG. 1A), and in that the block structure 23 does not completely surround the conductive elements 123 (as is the case in the configuration depicted in FIG. 1A).

The MEMS 21 is embedded within the carrier 10. A surface 211 (e.g., a bottom surface) of the MEMS 21 is substantially coplanar with the top surface 101 of the carrier 10. A surface 212 (e.g., a top surface or a backside surface) of the MEMS 21 is substantially coplanar with the bottom surface 102 of the carrier 10. For example, the bottom surface 211 of the MEMS 21 is exposed from the top surface 101 of the carrier 10 and the top surface 212 of the MEMS 11 is exposed from the bottom surface 102 of the carrier 10. For example, a thickness of the MEMS 21 is substantially the same as that of the carrier 10.

In some embodiments, the MEMS 11 may have a circuit layer 215 disposed on the bottom surface 211 of the MEMS 21. The circuit layer 215 may directly contact the conductive contacts 123 of the electronic component 12, and the conductive contacts 123 may provide electrical connections between the circuit layer 215 and the electronic component 12. The circuit layer 215 is exposed from the top surface 101 of the carrier 10.

In some embodiments, the MEMS 21 may include the sensing port 216 to receive at least one physical signal (e.g., sound, pressure, temperature, humidity, gas and the like), and the MEMS 21 may convert the received physical signal to an electrical signal (e.g. for subsequent processing). The sensing port 216 is exposed from the top surface 101 of the carrier 10. In some embodiments, the MEMS 21 can be a microphone, a barometer, a thermometer, a hygrometer, a gas detector and the like.

The block structure 23 is disposed on the top surface 101 of the carrier 10 and under a portion of the bottom surface 122 of the electronic component 12. The block structure 23 does not completely surround the conductive contacts 123 of the electronic component 12 and the circuit layer 215 of the MEMS 21. The block structure 23 may define at least one opening to allow the MEMS 21 to receive an external physical signal (e.g., sound, pressure, temperature, humidity, gas and the like). In some embodiments, the ring block structure 23 is made of non-conductive materials. In some embodiments, the block structure 23 can be removed from the semiconductor package structure 2. In some embodiments, the block structure 23 is not included in the semiconductor package structure 2.

Figure 3A:
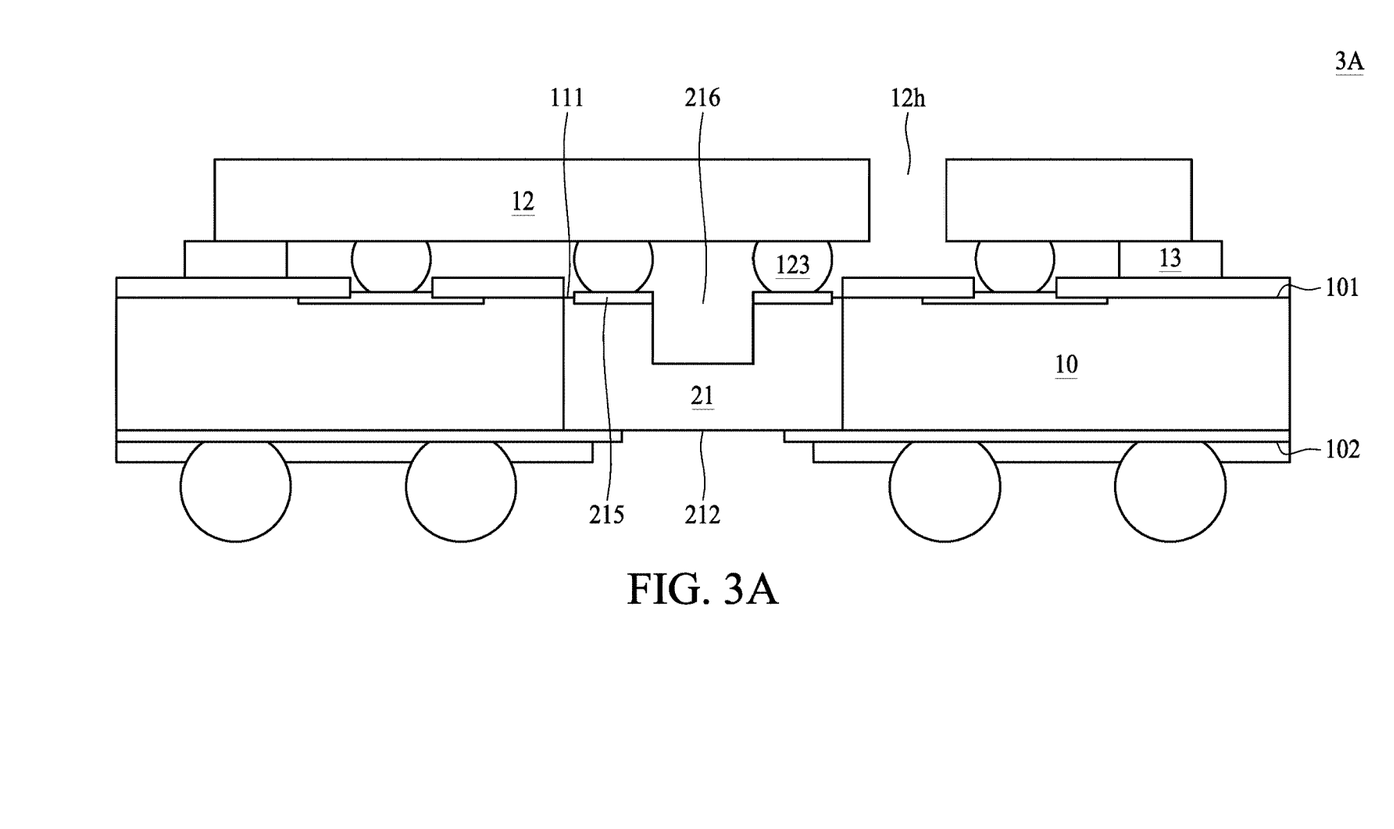
FIG. 3A illustrates a cross-sectional view of a semiconductor package structure in accordance with some embodiments of the present disclosure.

FIG. 3A illustrates a semiconductor package structure 3A in accordance with some embodiments of the present disclosure. The semiconductor package structure 3A is similar to the semiconductor package device 2 shown in FIG. 2, but differs at least in that the ring block structure 13 completely surrounds the conductive contacts 132 of the electronic component 12, and in that the electronic component 12 defines a hole 12h.

The hole 12h is formed to penetrate the electronic component 12 without damaging circuits or conductive wires in the electronic component 12. The hole 12h can be used to allow the MEMS 21 to receive an external physical signal (e.g., sound, pressure, temperature, humidity, gas and the like). In some embodiments, the hole 12h can be formed by drilling or laser drilling.

Figure 3B:
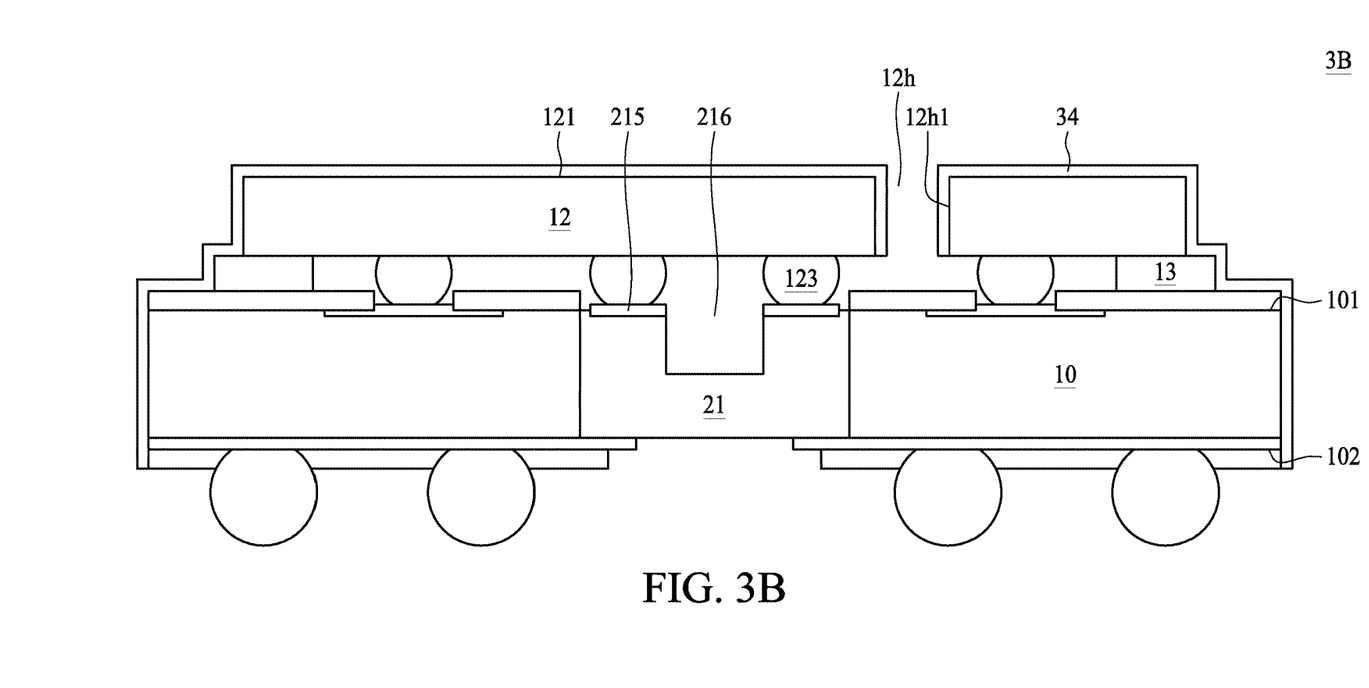
FIG. 3B illustrates a cross-sectional view of a semiconductor package structure in accordance with some embodiments of the present disclosure.

FIG. 3B illustrates a semiconductor package structure 3B in accordance with some embodiments of the present disclosure. The semiconductor package structure 3B is similar to the semiconductor package device 3A shown in FIG. 3A except that the semiconductor package device 3B further includes a shielding layer 34.

The shielding layer 34 is disposed on the backside surface 121 and lateral surfaces of the electronic component 12, a portion of the ring block structure 13, a portion of the top surface 101 of the carrier 10, laterals surface of the carrier 10 and a sidewall 12h1 of the hole 12h. The sidewall 12h1 may be a surface of the electronic component 12 that defines the hole 12h. The shielding layer 34 is electrically connected to the grounding element of the carrier 10. The shielding layer 34 can provide EMI shielding for the electronic component 12 and the MEMS 21. In some embodiments, the shielding layer 34 is a conformal shield. The shielding layer 34 is aligned with a bottom surface 102 of the carrier 10; for example, a bottom of the shielding layer 34 is substantially coplanar with the bottom surface 102 of the carrier 10. In some embodiments, the bottom of the shielding layer 14 is substantially coplanar with the bottom of the solder resist layer 10r2 disposed on the bottom surface 102 of the carrier 10. In some embodiments, the shielding layer 34 is similar to the shielding layer 14 shown in FIG. 1B.

Figure 4A:
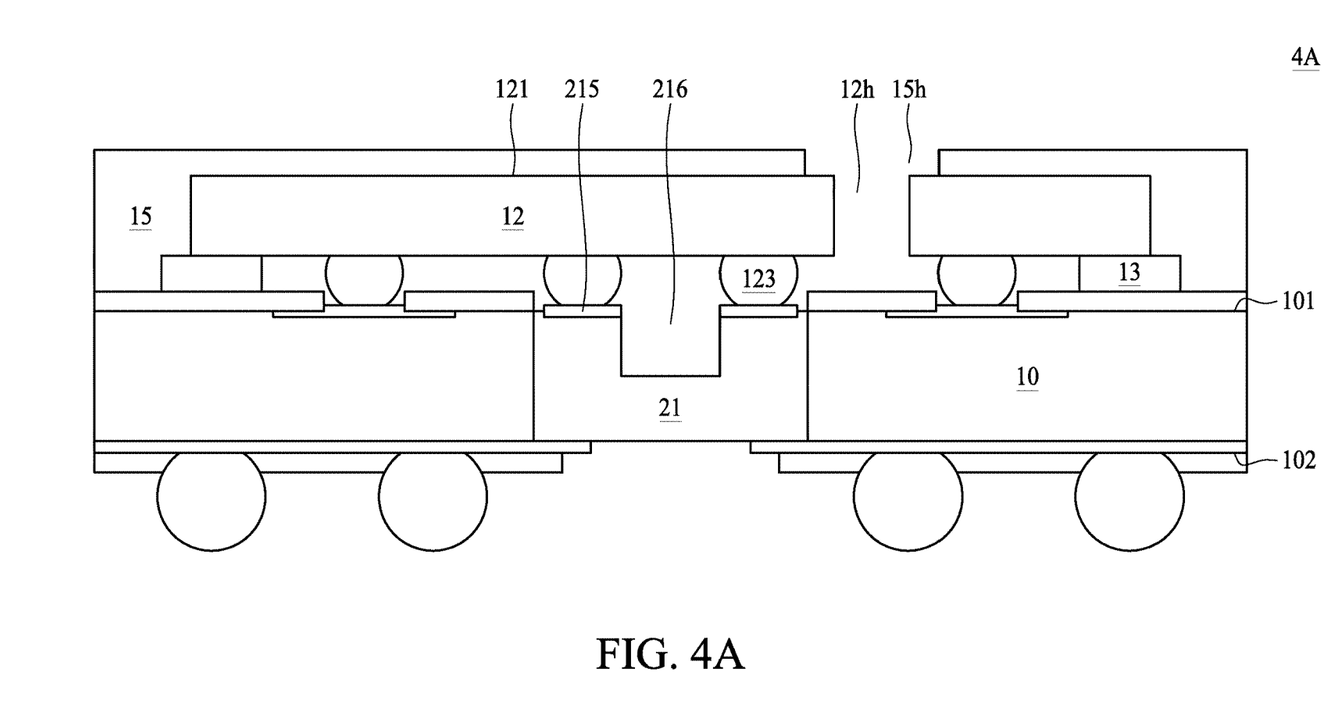
FIG. 4A illustrates a cross-sectional view of a semiconductor package structure in accordance with some embodiments of the present disclosure.

FIG. 4A illustrates a semiconductor package structure 4A in accordance with some embodiments of the present disclosure. The semiconductor package structure 4A is similar to the semiconductor package device 3A shown in FIG. 3A except that the semiconductor package device 4A further includes a package body 15.

The package body 15 is disposed on the top surface 101 of the carrier 10 and encapsulates a part of the top surface 101 of the carrier 10, a portion of the electronic component 12 and the ring block structure 13. In some embodiments, the package body 15 includes an epoxy resin having fillers dispersed therein. The package body may provide protection for the electronic component 12 (e.g. protection from physical damage).

A hole 15h is formed to penetrate the package body 15 to expose the hole 12h of the electronic component 12. The hole 15h may be defined by the package body 15. In some embodiments, the width of the hole 15h is greater than that of the hole 12h, such that a portion of the backside surface 121 of the electronic component 12 is exposed from the package body 15. In some embodiments, the hole 15h can be formed by drilling or laser drilling.

Figure 4B:
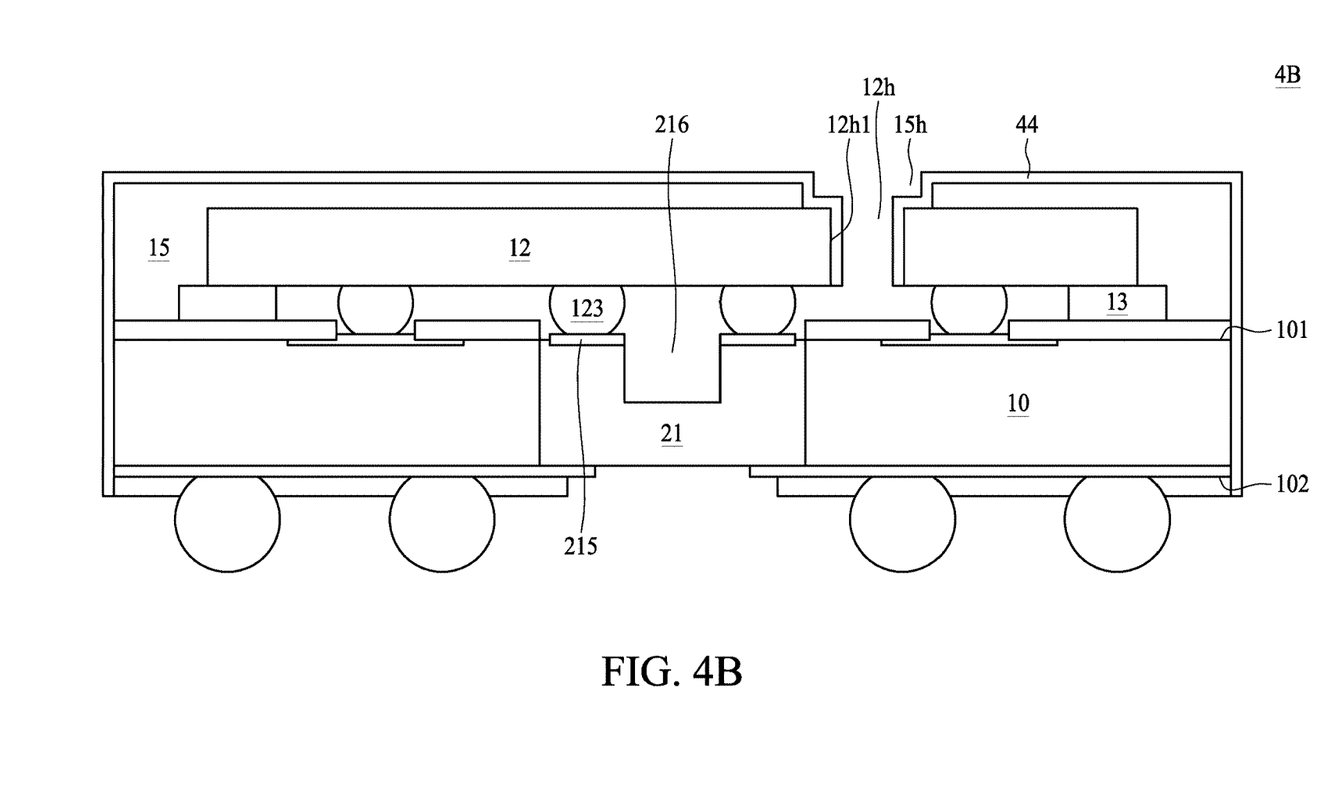
FIG. 4B illustrates a cross-sectional view of a semiconductor package structure in accordance with some embodiments of the present disclosure.

FIG. 4B illustrates a semiconductor package structure 4B in accordance with some embodiments of the present disclosure. The semiconductor package structure 4B is similar to the semiconductor package device 4A shown in FIG. 4A except that the semiconductor package device 4B further includes a shielding layer 44.

The shielding layer 44 is disposed on exterior surfaces of the package body 15, laterals surface of the carrier 10 and the sidewall 12h1 of the hole 12h. The shielding layer 44 is electrically connected to the grounding element of the carrier 10. The shielding layer 44 can provide EMI shielding for the electronic component 12 and the MEMS 21. In some embodiments, the shielding layer 44 is a conformal shield. The shielding layer 44 is aligned with a bottom surface 102 of the carrier 10; for example, a bottom of the shielding layer 44 is substantially coplanar with the bottom surface 102 of the carrier 10. In some embodiments, the bottom of the shielding layer 14 is substantially coplanar with the bottom of the solder resist layer 10r2 disposed on the bottom surface 102 of the carrier 10. In some embodiments, the shielding layer 44 is similar to the shielding layer 14 shown in FIG. 1B.

Figure 5A:
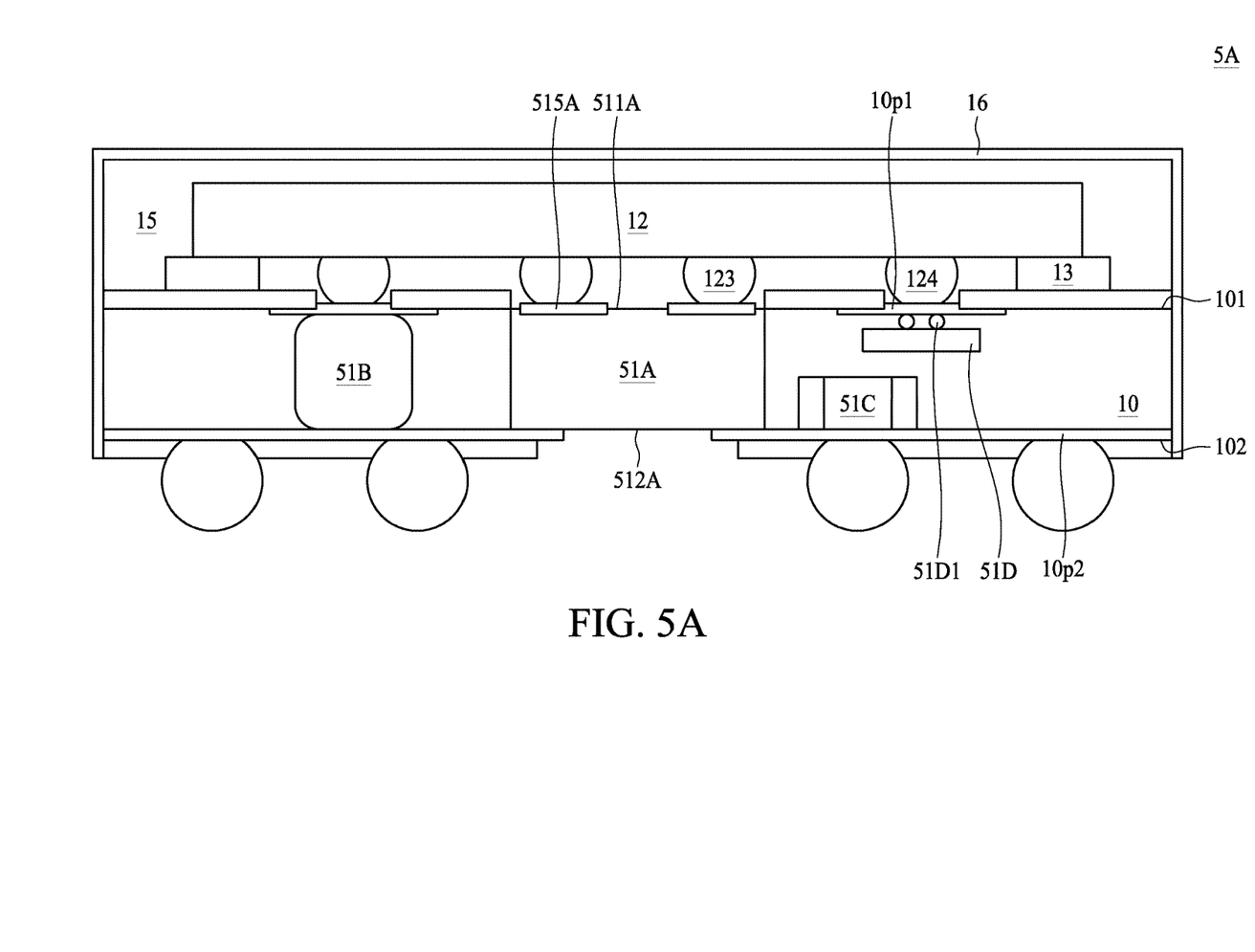
FIG. 5A illustrates a cross-sectional view of a semiconductor package structure in accordance with some embodiments of the present disclosure.

FIG. 5A illustrates a semiconductor package structure 5A in accordance with some embodiments of the present disclosure. The semiconductor package structure 5A is similar to the semiconductor package device 1D shown in FIG. 1D, except that the semiconductor package device 5A includes multiple MEMS (e.g. at least MEMS 51A, 51B) and multiple electronic components (e.g. at least electronic components 51C, 51D) embedded within the carrier 10.

The MEMS 51A is embedded within the carrier 10. A surface 511A (e.g., a top surface or a backside surface) of the MEMS 51A is substantially coplanar with the top surface 101 of the carrier 10. A surface 512A (e.g., a bottom surface) of the MEMS 51A is substantially coplanar with the bottom surface 102 of the carrier 10. For example, the top surface 511A of the MEMS 51A is exposed from the top surface 101 of the carrier 10 and the bottom surface 512A of the MEMS 51A is exposed from the bottom surface 102 of the carrier 10. For example, a thickness of the MEMS 51A is substantially the same as that of the carrier 10.

In some embodiments, the MEMS 51A may have a circuit layer 515A disposed on the top surface 511A of the MEMS 51A. The circuit layer 515A may provide electrical connections between the MEMS 51A and the electronic component 12. The circuit layer 515A is exposed from the top surface 101 of the carrier 10. In some embodiments, the circuit layer 515A of MEMS 51A may directly contact the electronic component 12.

In some embodiments, the MEMS 51A includes a sensor that can detect a physical signal (e.g., movement, velocity, acceleration, altitude and the like) without an opening, and the MEMS 51A can convert the detected physical signal to an electrical signal (e.g. for subsequent processing). In some embodiments, the MEMS 51A can be a gyroscope, a velocimeter, accelerometer, a pressure sensor and the like.

The MEMS 51B is embedded within the carrier 10. The thickness of the MEMS 51B is less than or equal to that of the MEMS 51A. In some embodiments, the MEMS 51B is substantially the same as the MEMS 51A. Alternatively, the MEMS 51B is different from the MEMS 51A.

The electronic component 51C is disposed within the carrier 10 and adjacent to the bottom surface 102 of the carrier 10. In some embodiments, the electronic component 51C directly contacts to the conductive pad 10p2 of the carrier 10. The electronic component 51C may be an active component (such as an IC chip or a die) or a passive electrical component (such as a capacitor, a resistor or an inductor). The electronic component 51C may be electrically connected to the conductive pad 10p2 of the carrier 10 by way of flip-chip or wire-bond techniques.

The electronic component 51D is disposed within the carrier 10 and adjacent to the top surface 101 of the carrier 10. In some embodiments, the electronic component 51D directly contacts to the conductive pad 10p1 of the carrier 10. The electronic component 51D may be an active component (such as an IC chip or a die) or a passive electrical component (such as a capacitor, a resistor or an inductor). The electronic component 51D may be electrically connected to the conductive pad 10p1 of the carrier 10 by way of flip-chip or wire-bond techniques.

By integrating more MEMS, such as MEMS 51A, 51B and electronic components, such as electronic components 51C, 51D into a same carrier 10, the total volume of the semiconductor package device 5A can be kept small.

Figure 5B:
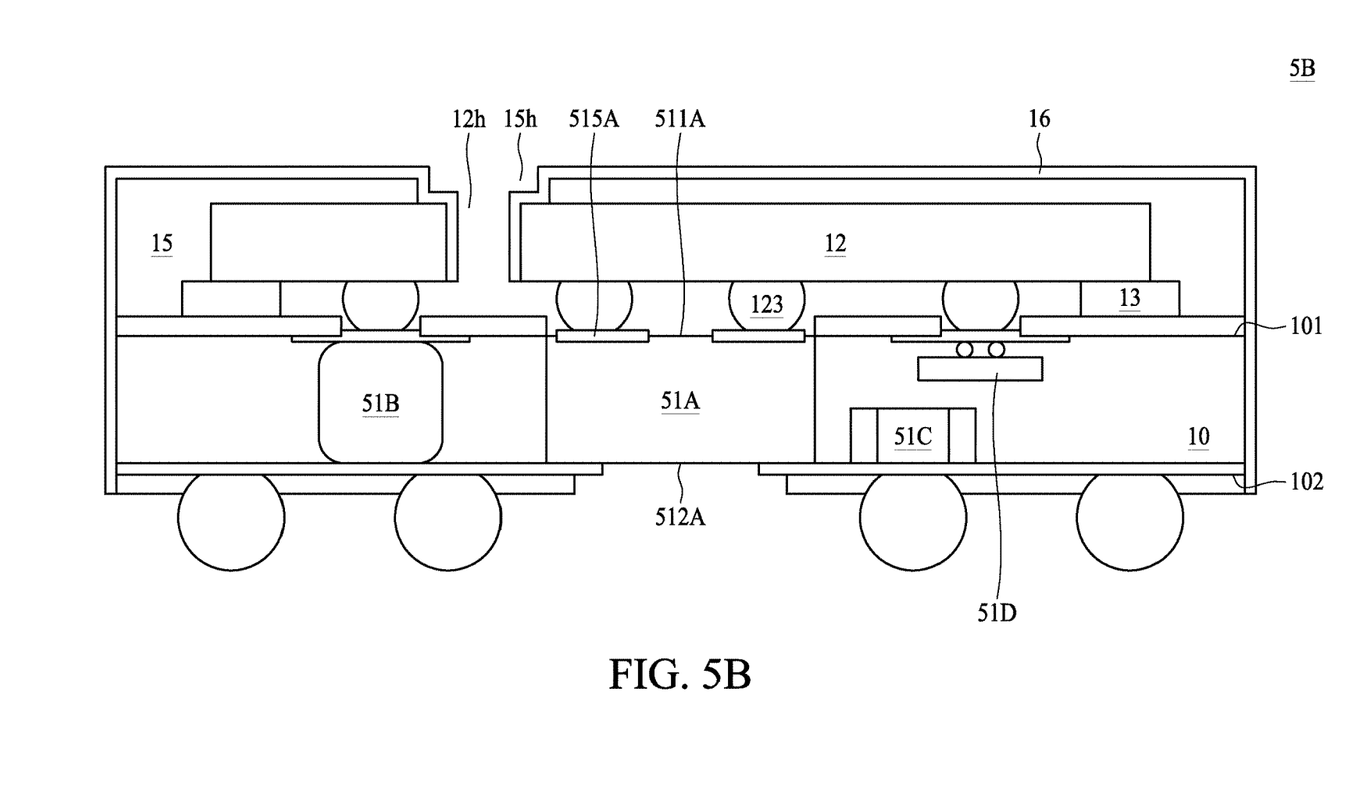
FIG. 5B illustrates a cross-sectional view of a semiconductor package structure in accordance with some embodiments of the present disclosure.

FIG. 5B illustrates a semiconductor package structure 5B in accordance with some embodiments of the present disclosure. The semiconductor package structure 5B is similar to the semiconductor package device 5A shown in FIG. 5A, except that the electronic component 12 defines a hole 12h and the package body 15 defines a hole 15h.

The hole 12h is formed to penetrate the electronic component 12 without damaging circuits or conductive wires in the electronic component 12. The hole 12h is used to facilitate the MEMS 51A or 51B receiving an external physical signal. In some embodiments, the hole 12h can be formed by drilling or laser drilling.

The hole 15h is formed to penetrate the package body 15 to expose the hole 12h of the electronic component 12. In some embodiments, the width of the hole 15h is greater than that of the hole 12h, so that a portion of the backside surface 121 of the electronic component 12 is exposed from the package body 15. In some embodiments, the hole 15h can be formed by drilling or laser drilling.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In some embodiments, two surfaces can be deemed to be coplanar or substantially coplanar if a displacement between the surfaces is small, such as no greater than 1 μm, no greater than 5 μm, or no greater than 10 μm.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device comprising:
   a carrier having a first surface and a second surface opposite the first surface;
   a first microelectromechanical system (MEMS) disposed in the carrier, the first MEMS being exposed from the first surface of the carrier and exposed from the second surface of the carrier;
   a first electronic component disposed on the first surface of the carrier and electrically connected to the first MEMS; and
   a ring block structure disposed on the first surface of the carrier, wherein the ring block structure surrounds the first MEMS and the first electronic component.

2. The semiconductor package device of claim 1, wherein the first MEMS has a top surface and a bottom surface, and the top surface of the first MEMS is substantially coplanar with the first surface of the carrier and the bottom surface of the first MEMS is substantially coplanar with the second surface of the carrier.

3. The semiconductor package device of claim 1, wherein the first MEMS comprises:
   a circuit layer exposed from the first surface of the carrier, the circuit layer directly contacting a conductive contact of the first electronic component; and
   a port exposed from the second surface of the carrier.

4. The semiconductor package device of claim 1, further comprises a shielding layer disposed on a backside surface of the first electronic component, a portion of the ring block structure, a portion of the first surface of the carrier and a lateral surface of the carrier.

5. The semiconductor package device of claim 1, further comprising a package body disposed on the first surface of the carrier encapsulating the first electronic component, a portion of the ring block structure and the first surface of the carrier.

6. The semiconductor package device of claim 5, further comprising a shielding layer disposed on the package body and a lateral surface of the carrier.

7. The semiconductor package device of claim 1, wherein the first electronic component defines a first hole that penetrates the first electronic component and exposes the first surface of the carrier.

8. The semiconductor package device of claim 7, further comprising a package body disposed on the first surface of the carrier encapsulating the first electronic component, a portion of the ring block structure and the first surface of the carrier, wherein the package body defines a second hole that exposes the first hole of the first electronic component.

9. The semiconductor package device of claim 8, further comprising a shielding layer disposed on the package body, a sidewall of the second hole of the package body and a lateral surface of the carrier.

10. The semiconductor package device of claim 1, wherein the electronic component defines a hole that penetrates the electronic component and exposes the first surface of the package body.

11. The semiconductor package device of claim 10, further comprising a shielding layer disposed on a backside surface of the first electronic component, a portion of the ring block structure, the first surface of the carrier, a lateral surface of the carrier and a sidewall of the hole.

12. The semiconductor package device of claim 1, wherein the first MEMS is at least one of a microphone, a pressure sensor, a motion sensor or a gas sensor.

13. The semiconductor package device of claim 1, wherein the first electronic component is disposed over the MEMS.

14. A semiconductor package device comprising:
a carrier having a first surface and a second surface opposite the first surface;
a MEMS disposed within the carrier, a thickness of the MEMS being substantially the same as a thickness of the carrier;
a processing chip disposed on the first surface of the carrier and electrically connected to the first MEMS; and
a ring block structure disposed on the first surface of the carrier, wherein the ring block structure surrounds the MEMS and the processing chip.

15. The semiconductor package device of claim 14, wherein the MEMS includes a circuit layer exposed from the first surface of the carrier and the circuit layer directly contacts a conductive contact of the processing chip.

16. A semiconductor package device comprising:
a carrier having a first surface and a second surface opposite the first surface;
a MEMS disposed within the carrier having a top surface and a bottom surface, the top surface of the MEMS being substantially coplanar with the first surface of the carrier and the bottom surface of the MEMS being substantially coplanar with the second surface of the carrier;
a processing chip disposed over the MEMS and electrically connected to the first MEMS; and
a ring block structure disposed on the first surface of the carrier, wherein the ring block structure surrounds the MEMS and the processing chip.

17. The semiconductor package device of claim 16, wherein the top surface of the MEMS is exposed from the first surface of the carrier and the bottom surface of the MEMS is exposed from the second surface of the carrier.

18. The semiconductor package device of claim 16, wherein the processing chip comprises a conductive contact, and the MEMS comprises:
a circuit layer exposed from the first surface of the carrier, the circuit layer directly contacting the conductive contact of the processing chip; and
a port exposed from the second surface of the carrier.

* * * * *